(12) United States Patent
Reber et al.

(10) Patent No.: US 11,148,534 B2
(45) Date of Patent: *Oct. 19, 2021

(54) COOLING UNIT FOR A CHARGING COLUMN, AND CHARGING COLUMN HAVING A COOLING UNIT

(71) Applicant: Dr. Ing. h.c. F. Porsche Aktiengesellschaft, Stuttgart (DE)

(72) Inventors: Volker Reber, Michelbach an der Bilz (DE); David Köhler, Bietigheim-Bissingen (DE); Stefan Götz, Forstern (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 338 days.

This patent is subject to a terminal disclaimer.

(21) Appl. No.: 16/026,164

(22) Filed: Jul. 3, 2018

(65) Prior Publication Data
US 2019/0016222 A1    Jan. 17, 2019

(30) Foreign Application Priority Data

Jul. 12, 2017  (DE) .......................... 102017115640.2

(51) Int. Cl.
*B60L 53/18* (2019.01)
*B60L 11/18* (2006.01)
(Continued)

(52) U.S. Cl.
CPC .......... *B60L 11/1825* (2013.01); *B60L 53/18* (2019.02); *B60L 53/31* (2019.02); *H05K 7/20272* (2013.01); *H05K 7/20927* (2013.01)

(58) Field of Classification Search
CPC ..................................................... B60L 53/302
See application file for complete search history.

(56) References Cited

U.S. PATENT DOCUMENTS 5,591,937 A * 1/1997 Woody .................. B60L 53/302
                                                   174/5 R
5,909,099 A * 6/1999 Watanabe ............... B60L 53/34
                                                   320/108
(Continued)

FOREIGN PATENT DOCUMENTS

CN   102790413 A   11/2012
CN   205681158 U   11/2016
(Continued)

OTHER PUBLICATIONS

Australian Examination Report for Australian Application No. 2018204414, dated Mar. 4, 2019, 3 pages.
(Continued)

*Primary Examiner* — Drew A Dunn
*Assistant Examiner* — Tynese V McDaniel
(74) *Attorney, Agent, or Firm* — RatnerPrestia

(57) ABSTRACT

A cooling unit for a charging column includes a heat exchanger with first connections and second connections and that is set up for cooling a closed secondary coolant circuit of the charging column if the first connections are fluidically connected to a common primary coolant circuit of the electric filling station and the second connections are fluidically connected to the secondary coolant circuit. Also described herein is a corresponding charging column.

10 Claims, 4 Drawing Sheets

(51) Int. Cl.
  *B60L 53/31*    (2019.01)
  *H05K 7/20*     (2006.01)

(56) References Cited

U.S. PATENT DOCUMENTS

| | | | |
|---|---|---|---|
| 6,396,241 | B1 | 5/2002 | Ramos et al. |
| 6,546,899 | B1 | 4/2003 | Friedrich et al. |
| 7,789,176 | B2 | 9/2010 | Zhou |
| 8,350,526 | B2 | 1/2013 | Dyer et al. |
| 9,132,743 | B2* | 9/2015 | Bianco .................. B60L 53/16 |
| 9,321,362 | B2* | 4/2016 | Woo ..................... B60L 53/11 |
| 10,029,575 | B2* | 7/2018 | Remisch ............. B60L 53/302 |
| 10,081,262 | B2 | 9/2018 | Nagel et al. |
| 10,611,254 | B2* | 4/2020 | Kohler ............... B60L 11/1825 |
| 10,717,367 | B1* | 7/2020 | Price ................. B60L 53/302 |
| 10,894,479 | B2* | 1/2021 | Reber .................. B60L 53/16 |
| 2009/0234705 | A1* | 9/2009 | Brunschwiler .... H05K 7/20836 62/259.2 |
| 2009/0273310 | A1* | 11/2009 | Flack ................. B60L 53/302 320/107 |
| 2012/0043935 | A1* | 2/2012 | Dyer .................. B60L 53/305 320/109 |
| 2012/0043943 | A1* | 2/2012 | Dyer .................... B60L 58/26 320/137 |
| 2013/0029193 | A1* | 1/2013 | Dyer .................... B60L 58/26 429/62 |
| 2013/0074525 | A1 | 3/2013 | Johnston et al. |
| 2013/0207606 | A1* | 8/2013 | Ranga .................. B60L 53/31 320/109 |
| 2013/0320921 | A1* | 12/2013 | Muller ................. H02J 7/0042 320/109 |
| 2014/0292260 | A1* | 10/2014 | Dyer ................... B60L 53/665 320/107 |
| 2015/0054460 | A1* | 2/2015 | Epstein ................. B60L 53/64 320/109 |
| 2015/0217654 | A1* | 8/2015 | Woo ..................... B60L 53/11 320/109 |
| 2015/0306974 | A1* | 10/2015 | Mardall ................. B60L 58/26 320/150 |
| 2016/0120058 | A1* | 4/2016 | Shedd ............... H05K 7/20327 165/244 |
| 2016/0221458 | A1* | 8/2016 | Lopez ................... B60L 53/14 |
| 2016/0305306 | A1 | 10/2016 | Oslislok et al. |
| 2017/0028862 | A1* | 2/2017 | Nagel ................... B60L 53/31 |
| 2017/0088005 | A1* | 3/2017 | Christen ............. B60L 11/1874 |
| 2017/0338006 | A1* | 11/2017 | Gontarz .............. H01R 13/005 |
| 2018/0170201 | A1* | 6/2018 | Miller ................... B60L 53/62 |
| 2018/0229616 | A1* | 8/2018 | Rhodes .................. F24D 7/00 |
| 2018/0304757 | A1* | 10/2018 | Vaughan ................ B60L 53/14 |
| 2018/0334049 | A1* | 11/2018 | Gotz .................. B60L 53/302 |
| 2018/0370374 | A1* | 12/2018 | Gotz .................... B60L 53/53 |
| 2019/0016219 | A1* | 1/2019 | Gro .................... B60L 58/26 |
| 2019/0047429 | A1* | 2/2019 | Torkelson ........... H01M 10/486 |
| 2019/0168593 | A1* | 6/2019 | Nakaso ............... B60L 53/302 |
| 2019/0217707 | A1* | 7/2019 | Reber .................... B60L 5/02 |
| 2019/0241093 | A1* | 8/2019 | Shimauchi ............ B60L 53/16 |
| 2019/0326762 | A1* | 10/2019 | Zoon .................. B60L 53/302 |
| 2019/0341661 | A1* | 11/2019 | Guerra .................. B60L 53/37 |
| 2020/0180457 | A1* | 6/2020 | Waffner .............. B60L 53/302 |
| 2020/0238845 | A1* | 7/2020 | Heyne ................. B60L 53/305 |
| 2020/0338998 | A1* | 10/2020 | Wainwright ........... B60L 53/66 |
| 2020/0343610 | A1* | 10/2020 | Agathocleous ....... H01M 10/44 |
| 2020/0361327 | A1* | 11/2020 | Heyne ................... H01B 3/305 |
| 2020/0366104 | A1* | 11/2020 | Stanfield ................ H02J 7/06 |
| 2021/0100138 | A1* | 4/2021 | Chen ..................... F16L 37/35 |

FOREIGN PATENT DOCUMENTS

| | | |
|---|---|---|
| CN | 205960730 U | 2/2017 |
| CN | 206225028 U | 6/2017 |
| DE | 102011100389 A1 | 5/2012 |
| DE | 102012104520 A1 | 11/2013 |
| DE | 102015105921 A1 | 10/2016 |
| DE | 102015112347 A1 | 2/2017 |
| DE | 102015120048 A1 | 5/2017 |
| EP | 0823766 A1 | 2/1998 |
| EP | 0823767 A1 | 2/1998 |
| EP | 1869391 B1 | 12/2007 |
| EP | 2344826 B1 | 7/2011 |
| EP | 3017990 A1 | 5/2016 |
| EP | 3282211 A1 | 2/2018 |
| EP | 3412494 A1 | 12/2018 |
| JP | H10261534 A | 9/1998 |
| JP | 2002528326 A | 9/2002 |
| WO | 2006110090 A1 | 10/2006 |
| WO | 2010056183 A2 | 5/2010 |
| WO | 2016163363 A1 | 10/2016 |

OTHER PUBLICATIONS

Chinese Office Action for Chinese Application No. 2018107512776, dated Sep. 23, 2019, 7 pages.
English translation of Chinese Office Action for Chinese Application No. 2018107512776, dated Jun. 10, 2020, 8 pages.
Notification of Reason for Rejection for Japanese Application No. 2018-129792, dated May 14, 2019, 3 pages.
Extended European Search Report for European Application No. EP 18 02 0057, dated Sep. 26, 2018, with partial English translation, 10 pages.
Australian Examination Report for Australian Application No. 2020201606, dated Oct. 16, 2020, 7 pages.
Chinese Notification of Reexamination for Chinese Application No. 201810751277.6, dated Apr. 21, 2021, with translation, 13 pages.

* cited by examiner

COOLING UNIT FOR A CHARGING COLUMN, AND CHARGING COLUMN HAVING A COOLING UNIT

CROSS-REFERENCE TO RELATED APPLICATION

This application claims priority to German Patent Application No. DE 10 2017 115 640.2, filed Jul. 12, 2017, which is incorporated by reference herein in its entirety.

FIELD OF THE INVENTION

The present invention relates to a cooling unit for a charging column. The present invention also relates to a corresponding charging column.

BACKGROUND OF THE INVENTION

In electrical engineering, any stationary device or electrical system which serves for supplying energy to mobile, battery-operated units, machines or motor vehicles by way of simple setting or insertion without it being necessary for the energy store—for example the traction battery of an electric automobile—to be removed is referred to as a charging station. Charging stations for electric automobiles are also referred to colloquially as "electric filling stations" and may comprise multiple charging points which, depending on the type of construction, are characterized as "charging columns".

Known here in particular are direct-current fast charging/high-performance charging (HPC) systems such as the so-called combined charging system (CCS), which is widespread in Europe. In the case of direct-current charging of this generic type, direct current is fed from the charging column directly into, the vehicle and, for this purpose, is provided by way of a powerful rectifier from the power supply system or by way of large buffer accumulators at solar filling stations. Situated, in the vehicle is a battery management system which communicates with the charging column in order to adapt the current intensity, or to terminate the process when a capacity limit is reached.

According to the prior art, the power electronics required for this purpose are normally integrated in the charging column and able to be loaded up to a power limit of 50 kW.

Since the direct-current connections of the charging column are connected directly to corresponding connections of the traction battery, it is thus possible for high charging currents to be transmitted with little loss, this allowing short charging times but also leading to generation of heat.

In order to keep the weight and the flexibility of the charging cable low for the user, cable cooling systems having charging cables through which liquid flows are described in the literature. CN 206225028, which is incorporated by reference herein, DE 102011100389, which is incorporated by reference herein, US 2012043935, which is incorporated by reference herein, US 2015217654, which is incorporated by reference herein, and US 2017028862, which is incorporated by reference herein, disclose by way of example charging cables of said type, in whose cable sheath a cooling fluid flows.

However, such systems have problems during installation, start-up and maintenance. The charging, cable, in particular, is subject to particularly high wear as a result of regular use, the weather or improper handling. However, the replacement and the installation generally require the fitting of the components of the cooling system or the connection of the cable cooling circuit to the cooling system of the charging column. For this purpose, it is necessary not only for cooling liquid to be introduced but additionally for the cooling circuit to be deaerated for problem-free operation. Said activities are time-consuming, susceptible to errors and commit maintenance teams locally to the charging columns.

Alternatives with leakage-free, or even dead-volume-free, plug connectors, which could avoid fining or deaeration are disproportionately expensive and, sensitive.

SUMMARY OF THE INVENTION

One advantage of the solution described herein is in the creation of an exchangeable cooling system. It is thus possible for the cooling system to be delivered and fitted already filled and deaeration of the cooling circuit on site to be avoided.

For this purpose the cooling circuit of the charging cable is connected via a heat exchanger to the liquid cooling circuit of the charging column, it being possible for the latter circuit to use a different cooling medium. All fasteners and couplings permit quick assembly.

The cooling unit is advantageously situated at a high point in the charging column. The cable together with the cooling unit can thus be lowered into the charging column from above during the assembly on site.

The fixing of the charging cable is realized solely by, a number of fixings of the sheath (with clamping action, at the outlet out of the charging column, and possibly in the supporting arm of the column) and by fixing or suspending the cooling unit in the interior of the charging column. The unit and the charging column are therefore formed in such a way that the cable can be placed and fitted in a rapid process without further complicated assembly steps.

BRIEF DESCRIPTION OF THE DRAWING

One exemplary embodiment of the invention is illustrated in the drawings and be described in more detail below. In the drawings.

DETAILED DESCRIPTION OF THE INVENTION

Figure 1:
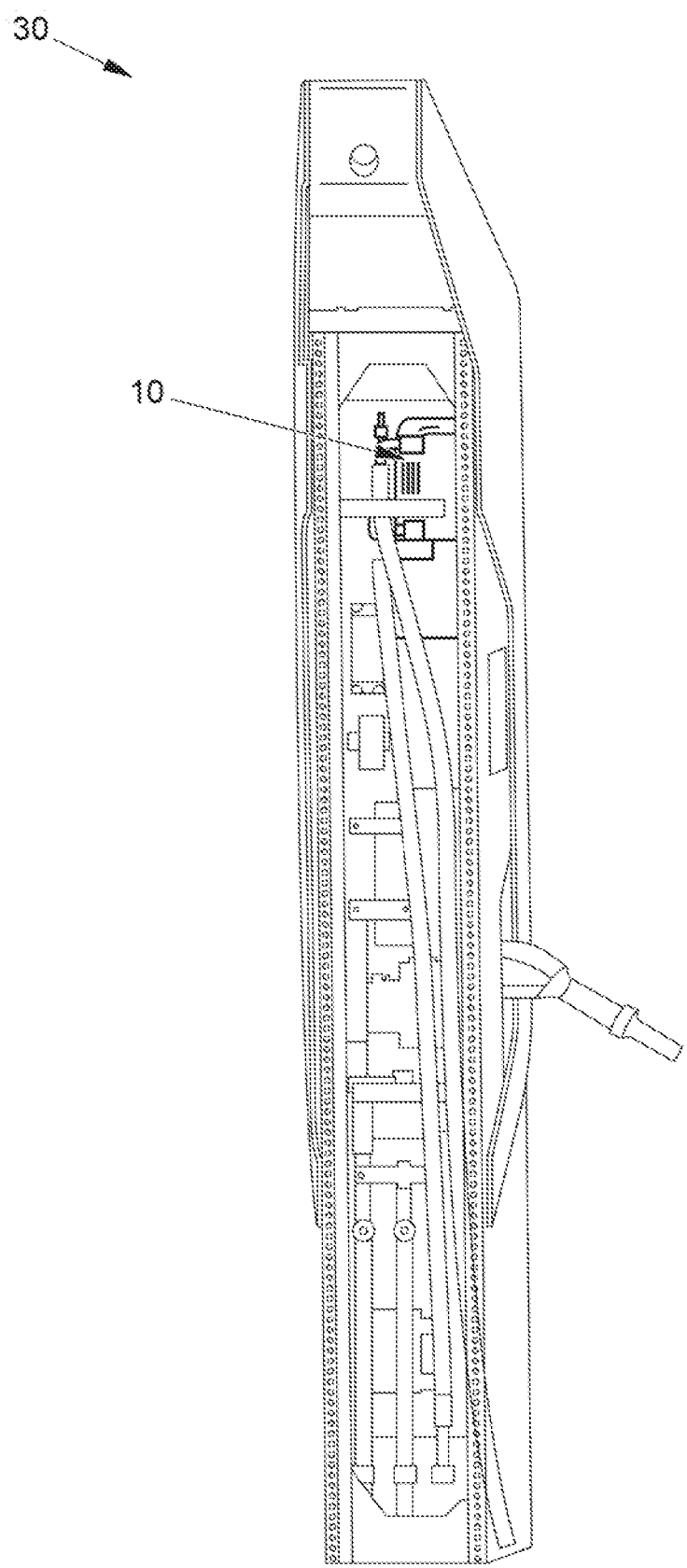
FIG. 1 shows the perspective view of a first charging column.

FIG. 1 illustrates the basic structure of the proposed charging column (30). The charging column (30) comprises a cooling unit (10) which cools the closed secondary coolant circuit of the charging column (30) if the charging column (30) is fiuidically connected to the common primary coolant circuit of multiple charging columns of an electric filling station.

Figure 2:
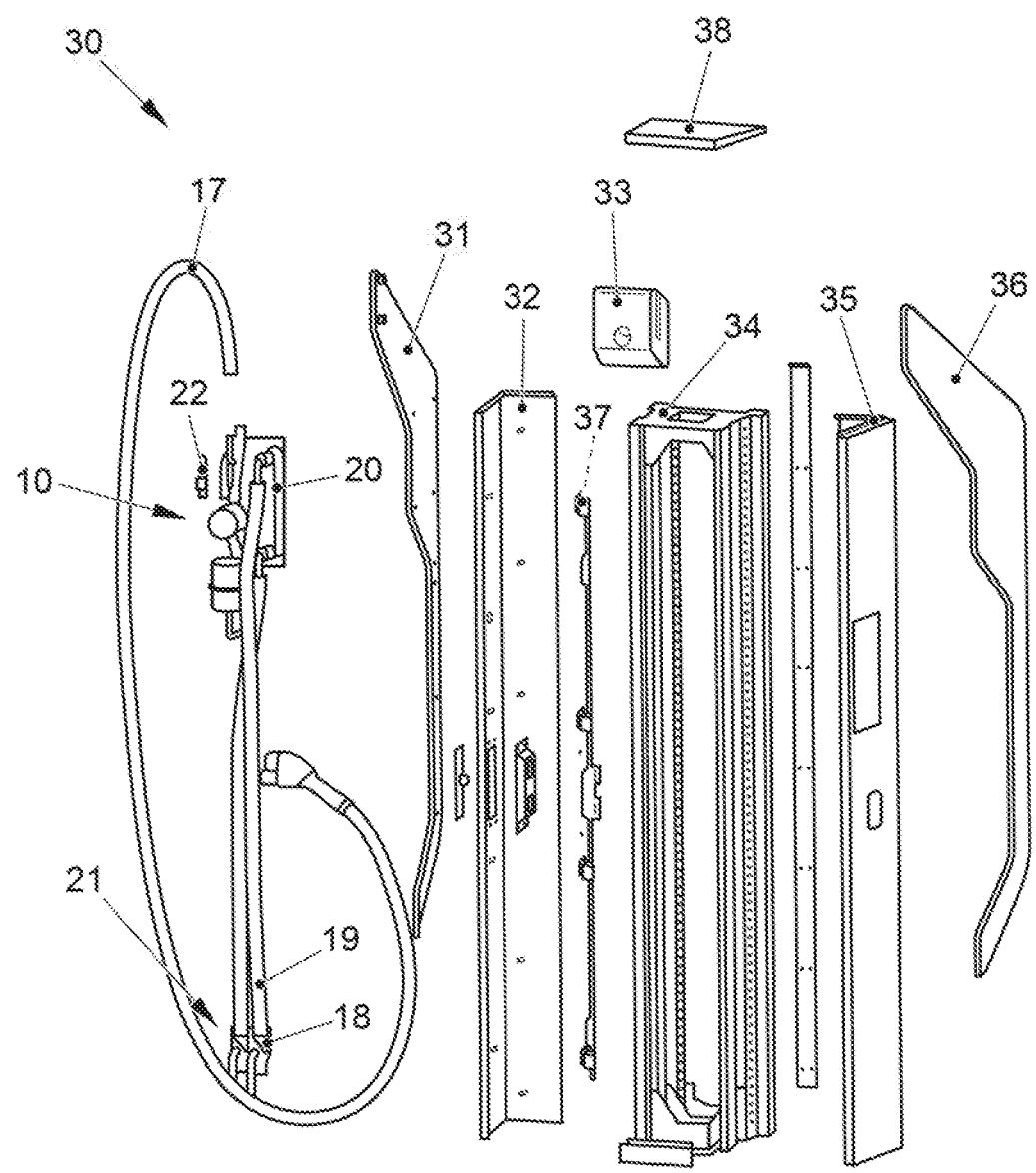
FIG. 2 shows the exploded illustration of a second charging column.
Figure 3:
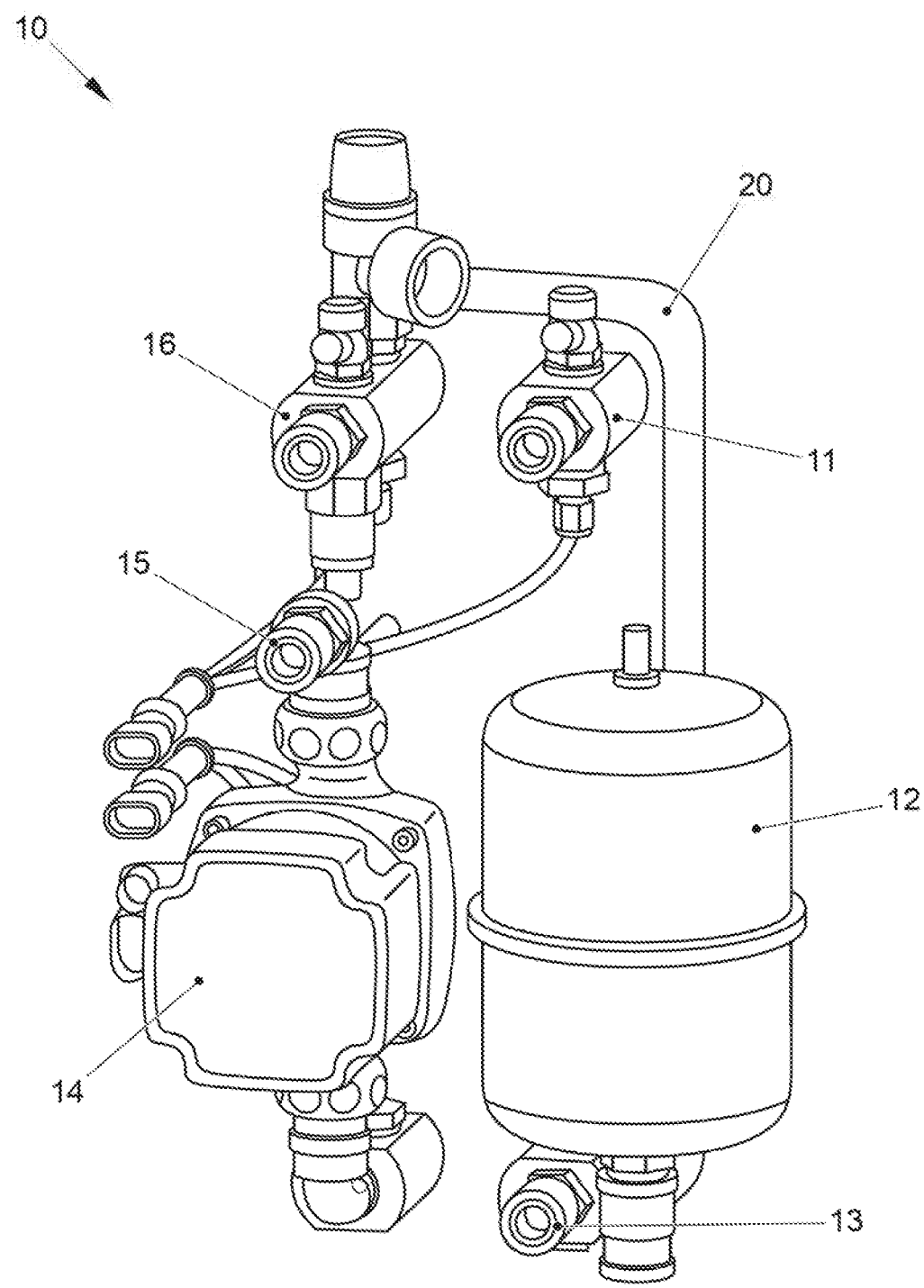
FIG. 3 shows the perspective view of a cooling unit of the second charging column.
Figure 4:
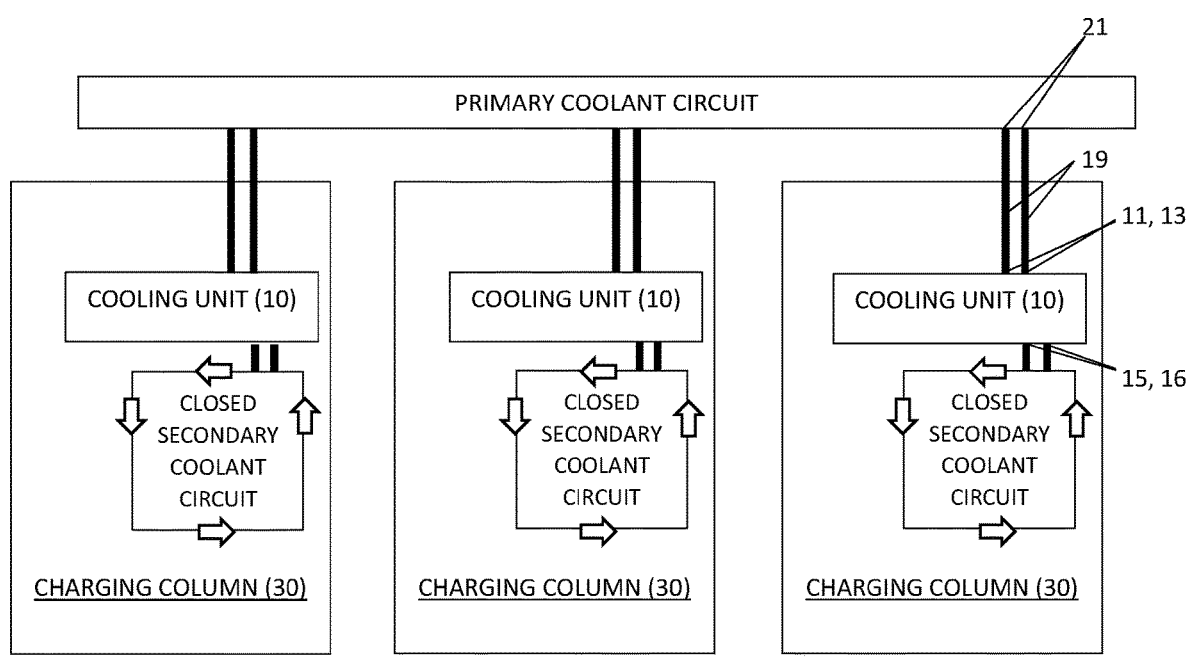
FIG. 4 shows a schematic block diagram of multiple charging columns connected to a primary coolant circuit.

A combined view of the slightly different embodiment as per FIG. 2 and its cooling unit (10) illustrated in detail in FIG. 3 illustrates this operating principle: the coding unit (10) is accordingly based on a heat exchanger (20) with first connections (11, 13) and second connections (15, 16). While the first connections (11, 13) are connected—via two hoses (19) with shut-off valves (18)—to the connection points (21) of the primary coolant circuit, the second connections (15,

16) feed the secondary coolant circuit via a pump (14) with a compensation vessel (12), it being intended for the heat of said secondary coolant circuit to be transferred to the primary coolant circuit via the heat exchanger (20). FIG. 4 shows a schematic block diagram of the cooling units of multiple charging columns connected to a primary coolant circuit. While the primary coolant circuit typically conducts a water glycol mixture, the secondary coolant circuit may be filled with a synthetic methoxy heptafluoropropane or nonafluoropropane, hydrofluoroether, or fluorinated ketone, for example distributed under the trade name "Novec", or some other non-conductive fluid which reacts as slowly as possible.

The cooling unit (10) prefabricated in this way is able to be lowered into the inner frame (34), illustrated in FIG. 2, of the charging column (30) in a simple manner with regard to assembly, the housing of which frame is formed from outer walls (32, 35) with bracket plates (31, 36) composed of sheet molding compound (SMC) bearing externally thereagainst and, in the present case, is accessible via a locking mechanism (37) of the left-hand outer wall (32). An upper cable holder (33) and a roof (38) with a drip edge are arranged in a form-fitting manner between the ends of the bracket plates (31, 36) which are the upper ones according to the drawings. The cable holder (33), in turn, is composed of two injection moldings which receive the cooled charging cable (17) between them by way of two cutouts which are formed in a complementary manner.

What is claimed is:

1. A charging column of an electric filling station, the charging column comprising:
   (i) a housing having side walls in the form of bracket plates, an interior region, a roof positioned between the bracket plates, a cable holder positioned beneath the roof and between the bracket plates, the cable holder being configured for receiving a cooled charging cable,
   (ii) the cooled charging cable for charging an electric vehicle, and
   (iii) an exchangeable cooling unit positioned entirely within the interior region, the exchangeable cooling unit comprising a heat exchanger with first connections and second connections, said first connections including hoses that are configured to be connected to a common primary coolant circuit that is shared between multiple charging columns of said electric filling station, and said second connections being configured to be connected to a closed secondary coolant circuit of the charging column including the cooled charging cable; said heat exchanger being configured to transfer heat from fluid in said secondary cooling circuit to a separate fluid in said common primary coolant circuit.

2. The charging column as claimed in claim 1, wherein the cooling unit further comprises a pump, and the pump is fluidically connected to the second connections.

3. The charging column as claimed in claim 2, wherein the cooling unit further comprises a compensation vessel, and the compensation vessel is fluidically connected to the pump.

4. The charging column as claimed in claim 1, wherein the second connections of the cooling unit are fluidically connected to the closed secondary coolant circuit.

5. The charging column as claimed in claim 1, wherein the secondary coolant circuit is filled with a slow-reacting, inert, non-conductive fluid.

6. The charging column as claimed in claim 1, wherein the secondary coolant circuit is filled with methoxy heptafluoropropane, methoxy nonafluoropropane, hydrofluoroether, or fluorinated ketone.

7. The charging column as claimed in claim 1, wherein the hoses have shut-off valves and connection points for connection to the primary coolant circuit, and the shut-off valves are arranged at the connection points.

8. The charging column as claimed in claim 1, wherein the charging column comprises a left-hand outer wall with a left-hand bracket plate of said bracket plates, a right-hand outer wall with a right-hand bracket plate of said bracket plates, and the roof having a drip edge, wherein the bracket plates bear externally against the outer walls, and the roof is arranged in a form-fitting manner between the bracket plates.

9. The charging column as claimed in claim 1, wherein the cable holder includes two injection moldings, and the cable holder is arranged in a form-fitting manner between the bracket plates and is covered by the roof.

10. The charging column as claimed in claim 8, wherein one of the outer walls has a locking mechanism.

* * * * *